United States Patent
Hara

(10) Patent No.: US 7,689,179 B2
(45) Date of Patent: Mar. 30, 2010

(54) MULTISTAGE AMPLIFIER APPARATUS WITH DISTORTION COMPENSATION FUNCTION

(75) Inventor: Yoshihiro Hara, Osaka (JP)

(73) Assignee: Panasonic Corporation, Osaka (JP)

( * ) Notice: Subject to any disclaimer, the term of this patent is extended or adjusted under 35 U.S.C. 154(b) by 498 days.

(21) Appl. No.: 11/822,125

(22) Filed: Jul. 2, 2007

(65) Prior Publication Data

US 2008/0018399 A1    Jan. 24, 2008

(30) Foreign Application Priority Data

Jul. 3, 2006  (JP) .............................. 2006-183723

(51) Int. Cl.
*H04B 1/04* (2006.01)
(52) U.S. Cl. .................... 455/114.3; 455/63.1; 330/149
(58) Field of Classification Search ................ 455/63.1, 455/114.3, 295; 330/133, 149
See application file for complete search history.

(56) References Cited

U.S. PATENT DOCUMENTS

| | | | |
|---|---|---|---|
| 6,191,653 B1 | 2/2001 | Camp, Jr. et al. | |
| 6,256,482 B1 | 7/2001 | Raab | |
| 6,388,518 B1 * | 5/2002 | Miyatani | 330/149 |
| 6,677,820 B2 * | 1/2004 | Miyatani | 330/149 |
| 6,925,106 B2 * | 8/2005 | Horaguchi et al. | 375/146 |
| 7,496,334 B2 * | 2/2009 | Saito | 455/114.3 |
| 2005/0226346 A1 * | 10/2005 | Ode et al. | 375/296 |
| 2007/0190952 A1 * | 8/2007 | Waheed et al. | 455/114.3 |

* cited by examiner

*Primary Examiner*—Nhan Le
(74) *Attorney, Agent, or Firm*—Wenderoth, Lind & Ponack, L.L.P.

(57) ABSTRACT

Provided are an amplifier section in which N amplifiers (N is an integer of 2 or more) are serially connected to one another, and which performs an amplitude modulation on an input signal using an amplitude signal, which is a control signal; and M distortion compensation apparatuses (M is a natural number satisfying M<N) which are respectively provided to M amplifiers of the N amplifiers, each of which retains a distortion compensation table in which a voltage of the amplitude signal and a distortion compensated voltage are correlated with each other, and provides the distortion compensated voltage which is correlated with the control signal, to a power supply terminal of a corresponding amplifier of the M amplifiers in accordance with the distortion compensation table. To power supply terminals of (N–M) amplifiers of the N amplifiers, to which the distortion compensated voltage is not inputted by any of the M distortion compensation apparatuses, the voltage of the power supply terminal is directly provided.

14 Claims, 10 Drawing Sheets

| Vramp1 [V] | Vramp2 [V] |
|---|---|
| 2.26 | 0.4 |
| 1.76 | 0.3 |
| 1.42 | 0.2 |
| 1.22 | 0.1 |
| 0.83 | 0.1 |
| 0.75 | 0.2 |
| 0.58 | 0.3 |
| 0.47 | 0.4 |
| 0.36 | 0.5 |

| Vramp1 [V] | Vramp2 [V] |
|---|---|
| 2.40 | 0.50 |
| 2.02 | 0.45 |
| 1.71 | 0.40 |
| 1.37 | 0.35 |
| 1.00 | 0.35 |
| 0.83 | 0.40 |
| 0.76 | 0.45 |
| 0.66 | 0.50 |

F I G. 1 4    PRIOR ART
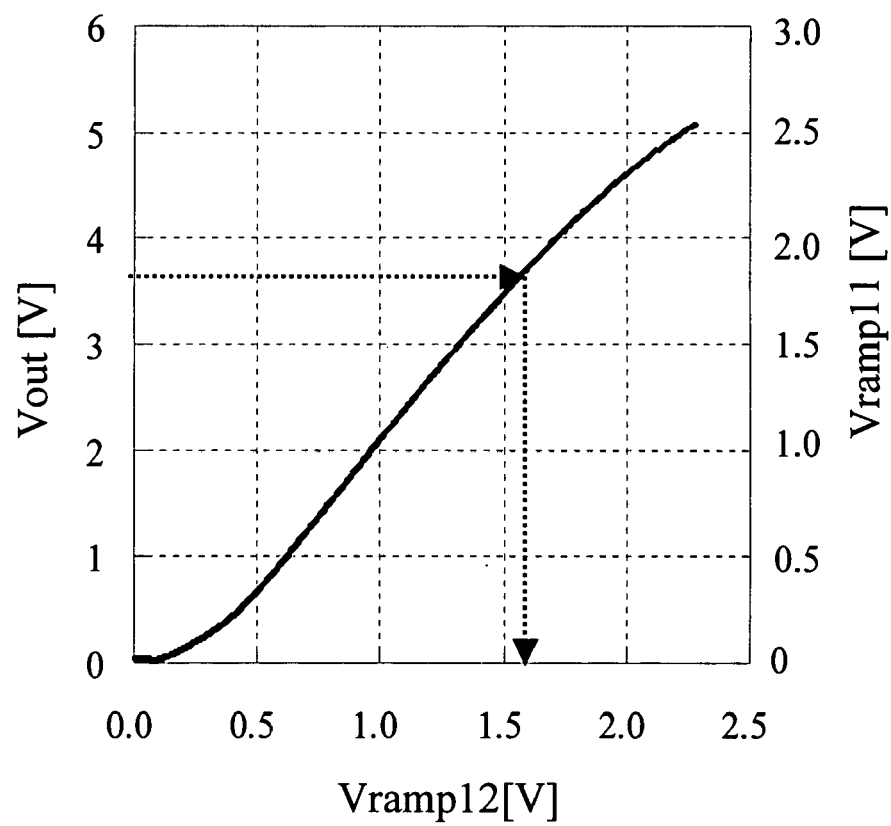

MULTISTAGE AMPLIFIER APPARATUS WITH DISTORTION COMPENSATION FUNCTION

BACKGROUND OF THE INVENTION

1. Field of the Invention

The present invention relates to a multistage amplifier apparatus with a distortion compensation function.

2. Description of the Background Art

For a transmitting apparatus or the like for performing communication using a radio frequency signal, an amplifier apparatus for amplifying a transmission signal is used. Generally, when a signal is amplified by an amplifier which constitutes the amplifier apparatus, the amplified signal is distorted, and a linear relationship between an input signal and an amplified output signal cannot be ensured. Therefore, in order to solve this problem, there is a method which provides a distortion compensation function to the amplifier. Further, there is a method in which, for the purpose of expanding a dynamic range of the output signal, a plurality of the amplifiers serially connected to one another is provided to the transmitting apparatus or the like, whereby a power gain is increased gradually. These methods may be also used in the case of amplifying a signal using a polar modulation.

FIG. 9 is a diagram showing an exemplary polar modulation amplifier apparatus 70 for amplifying a signal using a polar modulation. As with the polar modulation shown in FIG. 9, an inputted transmission signal is once separated into an amplitude component and a phase component, and then processed, whereby it is possible to realize a power saving amplifier apparatus having a small-circuit scale.

FIG. 10 is a conventional amplifier apparatus including a distortion compensation function which is disclosed in the U.S. Pat. No. 6,191,653 (Patent Document 1). The conventional amplifier apparatus disclosed in Patent Document 1 includes one amplifier, and performs distortion compensation using a feedback control.

FIG. 11 shows another conventional amplifier apparatus which is disclosed in the U.S. Pat. No. 6,256,482 (Patent Document 2) and has a plurality of amplifiers serially connected to one another. The conventional amplifier apparatus disclosed in Patent Document 2 uses the polar modulation, and the power gain of a transmission signal is gradually increased by two amplifiers.

Based on the above-described conventional techniques, a multistage amplifier apparatus having a distortion compensation function shown in FIGS. 12 and 13 may be devised easily. FIG. 12 is a diagram showing an exemplary configuration of a conventional multistage amplifier apparatus 100 using the polar modulation. As shown in FIG. 12, the conventional multistage amplifier apparatus 100 includes conversion circuits 54 and 55, a LUT (look up table) 53, and an amplifier section 56 constituted of an amplifier 51 and an amplifier 52 which are serially connected to each other. To a power supply terminal 61 of the amplifier 51, an output of the conversion circuit 54 is connected. To a power supply terminal 62 of the amplifier 52, an output of the conversion circuit 55 is connected. To an input of the conversion circuit 54 and an input of the conversion circuit 55, an output of the LUT 53 is connected.

Hereinafter, an operation of the conventional multistage amplifier apparatus 100 will be described. As shown in FIG. 12, a voltage of an amplitude signal AM11 to be inputted to the LUT 53 is represented by Vramp11, a voltage of an amplitude signal AM12 outputted by the LUT 53 is represented by Vramp12, a voltage of an amplitude signal AM13 outputted by the conversion circuit 54 is represented by Vramp13, a voltage of an amplitude signal AM14 outputted by the conversion circuit 55 is represented by Vramp14, and a voltage of an output signal Pout outputted by the amplifier section 56 is represented by Vout.

The LUT 53 outputs the voltage Vramp12 which allows a linear relationship between the voltage Vramp11 and the output voltage Vout in accordance with a table described hereinbelow.

FIG. 14 is an exemplary diagram showing a relation among the output voltage Vout, the voltage Vramp11, and the voltage Vramp12. As shown in FIG. 14, there is a value of the voltage Vramp12 which can ensure the linear relationship between the voltage Vramp11 and the output voltage Vout. Accordingly, the LUT 53 previously retains a table, which is prepared based on FIG. 14 and represents the relation between the voltage Vramp11 and the voltage Vramp12, and outputs the voltage Vramp12 corresponding to the voltage Vramp11 in accordance with the table, whereby it is possible to compensate for distortion of the amplifier section 56.

Next, the conversion circuit 54 converts the voltage Vramp12 to be inputted thereto, and provides the power supply terminal 61 of the amplifier 51 with the voltage Vramp13 for an optimal driving condition which is determined based on a relation between the amplifier 51 and the amplifier 52. The optimal driving condition is a condition which causes power efficiency, impedance, optimal saturation, and the like of the conventional multistage amplifier apparatus 100 to be comprehensively optimal. In a similar manner, the conversion circuit 55 converts the voltage Vramp12 to be inputted thereto, and provides the power supply terminal 62 of the amplifier 52 with the voltage Vramp14 for the optimal driving condition which is determined based on the relation between the amplifier 51 and the amplifier 52.

Next, the amplifier 51 performs amplitude modulation on an input signal Pin in accordance with the voltage Vramp13 provided to the power supply terminal 61, and outputs the amplitude-modulated signal to the amplifier 52. The amplifier 52 performs the amplitude modulation on the amplitude-modulated signal inputted by the amplifier 51 in accordance with the voltage Vramp14 provided to the power supply terminal 62, and outputs this further amplitude-modulated signal as the output signal Pout of the conventional multistage amplifier apparatus 100.

In this manner, in the conventional multistage amplifier apparatus 100, the input signal Pin is gradually amplified by a plurality of the amplifiers 51 and 52. Further, the LUT 53 performs the distortion compensation on the input signal Pin, whereby it is possible to realize less distorted power amplification.

FIG. 13 is a diagram showing an exemplary configuration of a conventional multistage amplifier apparatus 200 using the polar modulation. The conventional multistage amplifier apparatus 200 has a configuration in which the LUT 53, the conversion circuit 54, and the conversion circuit 55 of the conventional multistage amplifier apparatus 100 are replaced with a conversion circuit 57, a LUT 58, and a LUT 59, respectively.

Hereinafter, an operation of the conventional multistage amplifier apparatus 200 will be described. As shown in FIG. 13, a voltage of an amplitude signal AM11 inputted to the conversion circuit 57 is represented by Vramp11, a voltage of an amplitude signal AM15 outputted by the conversion circuit 57 to the LUT 58 is represented by Vramp15, a voltage of an amplitude signal AM16 outputted by the conversion circuit 57 to the LUT 59 is represented by Vramp16, a voltage of an amplitude signal AM17 outputted by the LUT 58 is represented by Vramp17, a voltage of an amplitude signal AM18 outputted by the LUT 59 is represented by Vramp18, and a voltage of an output signal Pout by the amplifier section 56 is represented by Vout.

The conversion circuit 57 converts the voltage Vramp11 to be inputted thereto, and outputs the voltage Vramp15 and the voltage Vramp16 for an optimal driving condition, which are determined based on the relation between the amplifier 51 and the amplifier 52, to the LUT 58 and the LUT 59, respectively. The optimal driving condition is the same as that described in the description of the conventional multistage amplifier apparatus 100. Next, the LUT 58 provides the voltage Vramp17, which allows a linear relationship between the voltage Vramp15 and a voltage of an output signal from the amplifier 51, to a power supply terminal 61 of the amplifier 51. In a similar manner, the LUT 59 provides the voltage Vramp18, which allows a linear relationship between the voltage Vramp16 to be inputted thereto and a voltage of an output signal from the amplifier 52, to a power supply terminal 62 of the amplifier 52.

In the same manner as the LUT 53 of the conventional multistage amplifier apparatus 100, the LUT 58 previously retains a table which represents a relation between the voltage Vramp15 and the voltage Vramp17 and which allows the linear relationship between the voltage Vramp15 and the voltage of the output signal from the amplifier 51. In a similar manner, the LUT 59 previously retains a table which represents a relation between the voltage Vramp16 and the voltage Vramp18 and which allows the linear relationship between the voltage Vramp16 and the voltage of the output signal from the amplifier 52.

Next, the amplifier 51 performs amplitude modulation on the input signal Pin in accordance with the voltage Vramp17 provided to the power supply terminal 61, and outputs the amplitude-modulated signal to the amplifier 52. The amplifier 52 then performs the amplitude modulation on the amplitude-modulated signal inputted by the amplifier 51 in accordance with the voltage Vramp18 provided to the power supply terminal 62, and outputs the further amplitude-modulated signal as an output signal Pout of the conventional multistage amplifier apparatus 200.

In this manner, in the conventional multistage amplifier apparatus 200, the input signal Pin is gradually amplified by a plurality of the amplifiers 51 and 52. Further, the LUT 58 and the LUT 59 perform distortion compensation on the input signal Pin, whereby it is possible to realize less distorted power amplification.

However, in the above-described conventional multistage amplifier apparatus 100, in order to provide an amplitude signal voltage for the optimal driving condition to the power supply terminal 61 of the amplifier 51 and the power supply terminal 62 of the amplifier 52, the same number of conversion circuits 54 and 55 as the amplifiers 51 and 52 are required. Further, the LUT 53 is required which improves a linearity characteristic between the input and the output of the conventional multistage amplifier apparatus 100.

Accordingly, the conventional multistage amplifier apparatus 100 has a problem in that a circuit scale, manufacturing costs, and power consumption thereof increase.

Further, in the above-described conventional multistage amplifier apparatus 200, in order to provide the amplitude signal voltage for the optimal driving condition to the power supply terminal 61 of the amplifier 51 and the power supply terminal 62 of the amplifier 52, the conversion circuit 57 is required. Further, in order to improve a linearity characteristic between the input and output of the conventional multistage amplifier apparatus 200, the same number of LUTs 58 and 59 as the amplifiers 51 and 52 are required. Accordingly, the conventional multistage amplifier apparatus 200 also has a problem in that a circuit scale, manufacturing costs and power consumption thereof increase.

SUMMARY OF THE INVENTION

Therefore, an object of the present invention is to compensate for distortion of an output signal of a multistage amplifier apparatus, and to provide a multistage amplifier apparatus which suppresses an increase in a circuit scale, and reduces manufacturing costs and power consumption.

The present invention is directed to a multistage amplifier apparatus for amplifying an input signal using a control signal. To attain the above-described object, the multistage amplifier apparatus of the present invention includes: an amplifier section in which N amplifiers (N is an integer of 2 or more) are serially connected to one another, for performing amplitude modulation on the input signal using an amplitude signal which is the control signal; and M distortion compensation apparatuses (M is a natural number satisfying M<N) which are provided so as to respectively correspond to M amplifiers among the N amplifiers, each for retaining a distortion compensation table in which a voltage of the amplitude signal and a distortion compensated voltage are correlated with each other, and the M distortion compensation apparatuses each providing, based on the distortion compensation table, the distortion compensated voltage which is correlated with the control signal, to a power supply terminal of a corresponding amplifier of the M amplifiers. To power supply terminals of (N−M) amplifiers, to which the distortion compensated voltage is not inputted by the M distortion compensation apparatus, the voltage of the amplitude signal is directly provided.

Further, it is preferable that the distortion compensated voltage is a voltage which allows a linear relationship between the voltage of the amplitude signal and a voltage to be outputted by the amplifier section. Further, the input signal on which the amplitude modulation is performed may be a phase-modulated signal, an amplitude-modulated signal, a frequency-modulated signal, an amplitude/phase modulated signal, or an amplitude/frequency modulated signal.

Further, the present invention is directed to a polar modulation amplifier apparatus. The polar modulation amplifier apparatus of the present invention includes: an amplitude/phase separation section for separating a transmission signal to be inputted thereto into an amplitude signal and a phase signal; a phase modulation section for performing phase modulation on the phase signal; and the multistage amplifier apparatus for performing, by using the amplitude signal, amplitude modulation of the phase signal on which the phase modulation is performed by the phase modulation section.

Further, the present invention is also directed to a wireless communication apparatus for performing communication using an antenna. The wireless communication apparatus of the present invention includes: a transmission processing section including the multistage amplifier apparatus of the present invention for performing transmission processing and outputting a transmission signal; a reception processing section for performing reception processing on a received signal which is received by the antenna; and a transmission-reception switching section for switching between a state in which the transmission signal is provided from the transmission processing section to the antenna and a state in which the received signal is provided from the antenna to the reception processing section.

According to the present invention, it is possible to compensate for the distortion of the output signal of the multistage amplifier apparatus, and also possible to realize the multistage amplifier apparatus which suppresses an increase in a circuit scale and to reduce manufacturing costs and power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a diagram showing a relation among an output voltage Vout, a voltage Vramp11, and a voltage Vramp12 of the conventional multistage amplifier apparatus 100 shown in FIG. 12.

DESCRIPTION OF THE PREFERRED EMBODIMENTS

Figures 1, 2:
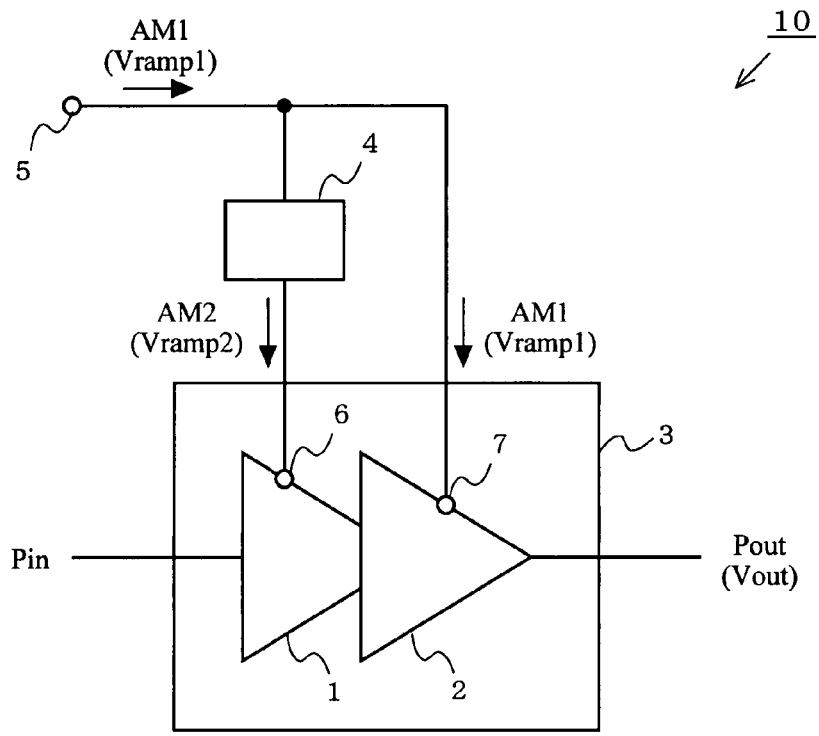
FIG. 1 is a diagram showing a configuration of a multistage amplifier apparatus 10 having a distortion compensation function according to one embodiment of the present invention.
FIG. 2 is a diagram showing an exemplary distortion compensation table 15 retained by a distortion compensation apparatus 4 shown in FIG. 1.

FIG. 1 is a diagram showing a configuration of a multistage amplifier apparatus 10 having a distortion compensation function according to one embodiment of the present invention. As shown in FIG. 1, the multistage amplifier apparatus 10 of the present invention includes an amplifier section 3 which is constituted of an amplifier 1 and an amplifier 2, and a distortion compensation apparatus 4. The amplifier 1 and the amplifier 2 are serially connected to each other. A power supply terminal 6 of the amplifier 1 is connected to an output of the distortion compensation apparatus 4. A power supply terminal 7 of the amplifier 2 and an input of the distortion compensation apparatus 4 are connected to an input terminal 5. The distortion compensation apparatus 4 previously retains a distortion compensation table 15 which compensates for distortion of an output signal Pout of the multistage amplifier apparatus 10. FIG. 2 is a diagram showing an exemplary distortion compensation table 15 retained by the distortion compensation apparatus 4 shown in FIG. 1.

First, an operation of the multistage amplifier apparatus 10 will be described. As shown in FIG. 1, a voltage of an amplitude signal AM1, which is a control signal to be inputted to the input terminal 5, is represented by Vramp1, a voltage of an amplitude signal AM2, which is distortion compensated and outputted by the distortion compensation apparatus 4, is represented by Vramp2, and a voltage of the output signal Pout, which is outputted by the amplifier section 3, is represented by Vout.

The voltage Vramp1 provided to the input terminal 5 is inputted to the power supply terminal 7 of the amplifier 2 and the distortion compensation apparatus 4. The distortion compensation apparatus 4 outputs, based on the distortion compensation table 15 (see FIG. 2) previously retained thereby, the voltage Vramp2 which corresponds to the voltage Vramp1 having been inputted thereto. Specifically, the distortion compensation apparatus 4 outputs 0.2V as the voltage Vramp2 when 1.42V is inputted thereto as the voltage Vramp1, and outputs 0.3V as the voltage Vramp2 when 1.76V is inputted thereto as the voltage Vramp1.

The amplifier 1 performs amplitude modulation on an input signal Pin in accordance with the voltage Vramp2 provided to the power supply terminal 6. The amplifier 1 outputs the amplitude-modulated signal, which is modulated based on the voltage Vramp2, to the amplifier 2. The amplifier 2 performs the amplitude modulation on the amplitude-modulated signal, which is inputted by the amplifier 1, in accordance with the voltage Vramp1 provided to the power supply terminal 7. The amplifier 2 outputs the further amplitude-modulated signal in accordance with the voltage Vramp1 as an output signal Pout of the multistage amplifier apparatus 10.

Figure 3:
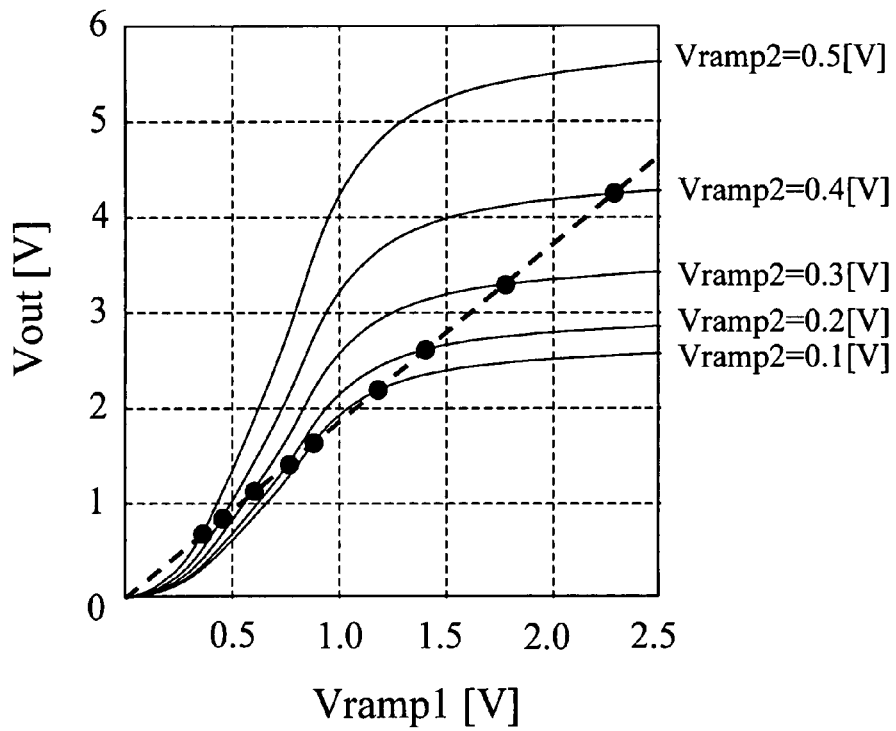
FIG. 3 is a diagram showing a relation among an output voltage Vout, a voltage Vramp1, and a voltage Vramp2 of the multistage amplifier apparatus 10 shown in FIG. 1.

FIG. 3 is a diagram showing dependence of the output voltage Vout on the voltage Vramp2 provided to the power supply terminal 6 of the amplifier 1 and on the voltage Vramp1 provided to the power supply terminal 7 of the amplifier 2 in the multistage amplifier apparatus 10 shown in FIG. 1. FIG. 3 shows an output in the case where the voltage Vramp1 of the amplifier 2 is changed by using the voltage Vramp2 of the amplifier 1 as a parameter. FIG. 3 also shows an input/output characteristic when the voltage Vramp1 and the voltage Vramp2 are respectively changed independently.

As shown in FIG. 3, it is clear that there is a value of the voltage Vramp2 which allows a linear relationship between the voltage Vramp1 and the output voltage Vout. Therefore, the value of the voltage Vramp2 is changed so as to allow the linear relationship between the voltage Vramp1 and the output voltage Vout, whereby it is possible to compensate for a linearity characteristic of the multistage amplifier apparatus 10. In FIG. 3, a plurality of values of the voltage Vramp2, which allows the linear relationship between the voltage Vramp1 and the output voltage Vout, constitutes a dashed line, and a gradient thereof is arbitrary. Accordingly, by selecting the gradient, it is possible to optimize power efficiency, impedance, saturation and the like of the multistage amplifier apparatus 10.

The distortion compensation table 15 retained by the distortion compensation apparatus 4 is a table which represents a correlation of the voltage Vramp2, which allows the linear relationship between the voltage Vramp1 and the output voltage Vout, with the voltage Vramp1. Therefore, based on the distortion compensation table 15, the distortion compensation apparatus 4 provides the voltage Vramp2 corresponding to the voltage Vramp1 having been inputted thereto to the power supply terminal 6 of the amplifier 1, whereby the linearity characteristic of the multistage amplifier apparatus 10 can be compensated.

Figure 4:
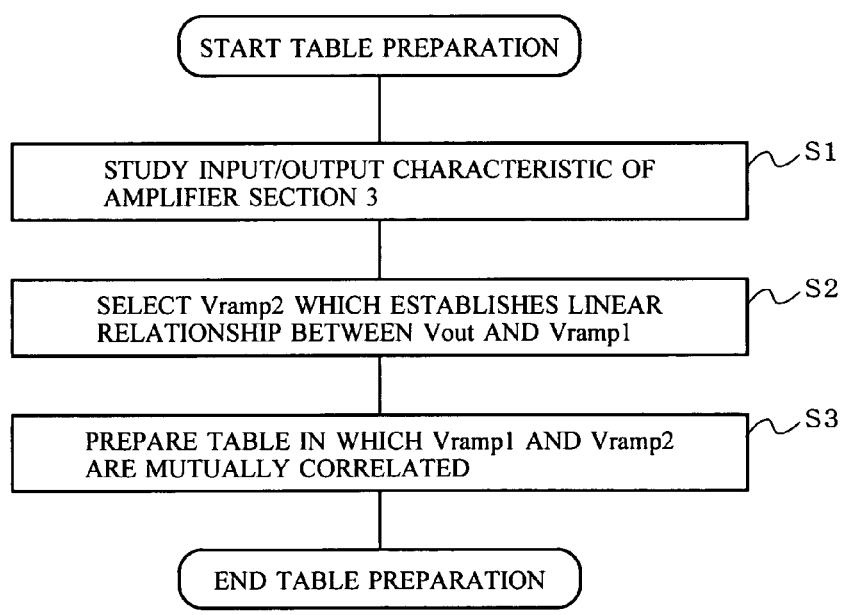
FIG. 4 is a diagram showing a procedure for preparing the distortion compensation table 15.

Hereinafter, a method of preparing the distortion compensation table 15 previously retained by the distortion compensation apparatus 4 will be described. FIG. 4 is a diagram showing a procedure for preparing the distortion compensation table 15.

As shown in FIG. 4, first, an input/output characteristic (a characteristic shown in FIG. 3) of the amplifier section 3 is studied (step S1). Next, based on the input/output characteristic of the amplifier section 3, a value of the voltage Vramp2 which allows the linear relationship between a value of the output voltage Vout and a value of the voltage Vramp1 is selected (step S2). The value of the voltage Vramp1 and the selected value of the voltage Vramp2 are correlated with each other, and a table is prepared (step S3). In this manner, the distortion compensation table 15 is prepared.

As above described, according to the multistage amplifier apparatus 10 based on the one embodiment of the present invention, without having a conversion circuit of the conventional multistage amplifier apparatus, it is possible to provide different voltages, respectively, to the power supply terminal 6 and the power supply terminal 7 of the two amplifiers serially connected to each other. Accordingly, it is possible to ensure the power efficiency or the like of the multistage amplifier apparatus 10 as a whole, and also possible to suppress an increase in a circuit scale thereof.

Further, according to the multistage amplifier apparatus 10 based on the one embodiment of the present invention, instead of a LUT and the conversion circuit of the conventional multistage amplifier apparatus, only one distortion compensation apparatus is provided, whereby the linearity characteristic (distortion of the output signal) can be compensated. Accordingly, compared to the conventional multistage amplifier apparatus, it is possible to reduce the manufacturing costs and the power consumption.

Even in the case where the amplifier section 3 of the multistage amplifier apparatus 10 has a configuration in which three or more amplifiers are serially connected to one another, the same effect as above described may be obtained. Hereinafter, a case will be described briefly where the amplifier section 3 of the multistage amplifier apparatus 10 has a configuration in which three amplifiers are serially connected to one another.

Figure 5:
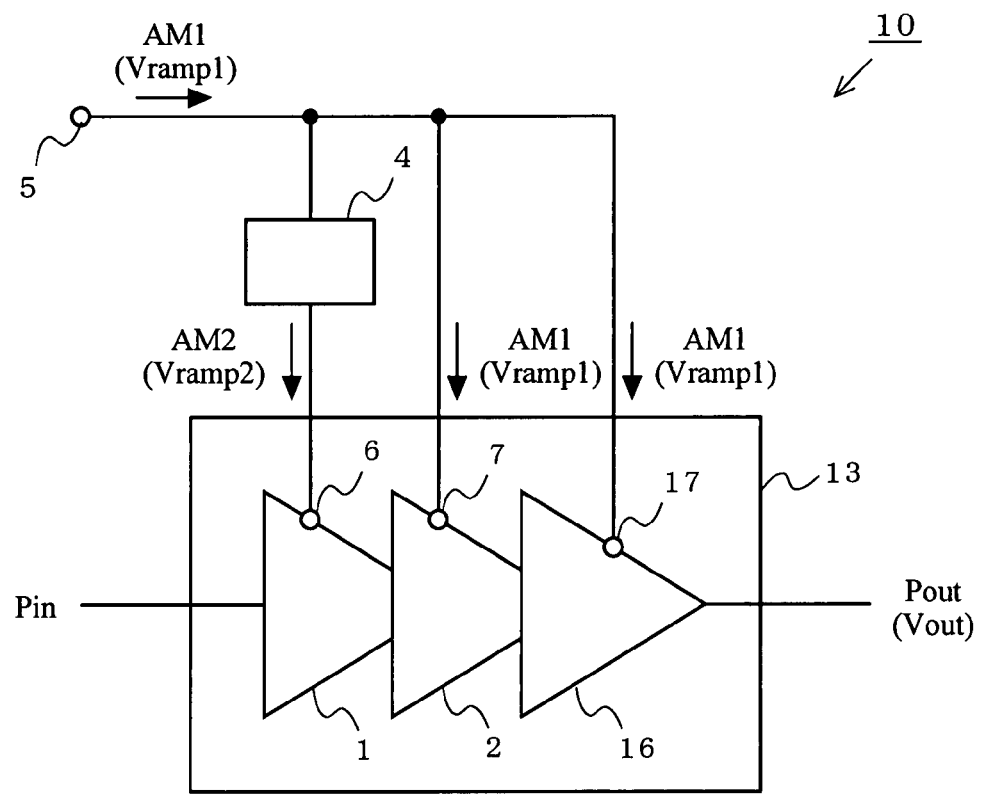
FIG. 5 is a diagram showing a configuration of another multistage amplifier apparatus 10 having a distortion compensation function according to one embodiment of the present invention.

FIG. 5 is a diagram showing a configuration of another multistage amplifier apparatus 10 having a distortion compensation function in the case where the amplifier section 3 is constituted of three serially connected amplifiers. As shown in FIG. 5, an amplifier section 13 has a configuration in which the amplifier 1, the amplifier 2, and an amplifier 16 are serially connected to one another. To the power supply terminal 6 of the amplifier 1, the output of the distortion compensation apparatus 4 is connected.

Figures 6, 7:
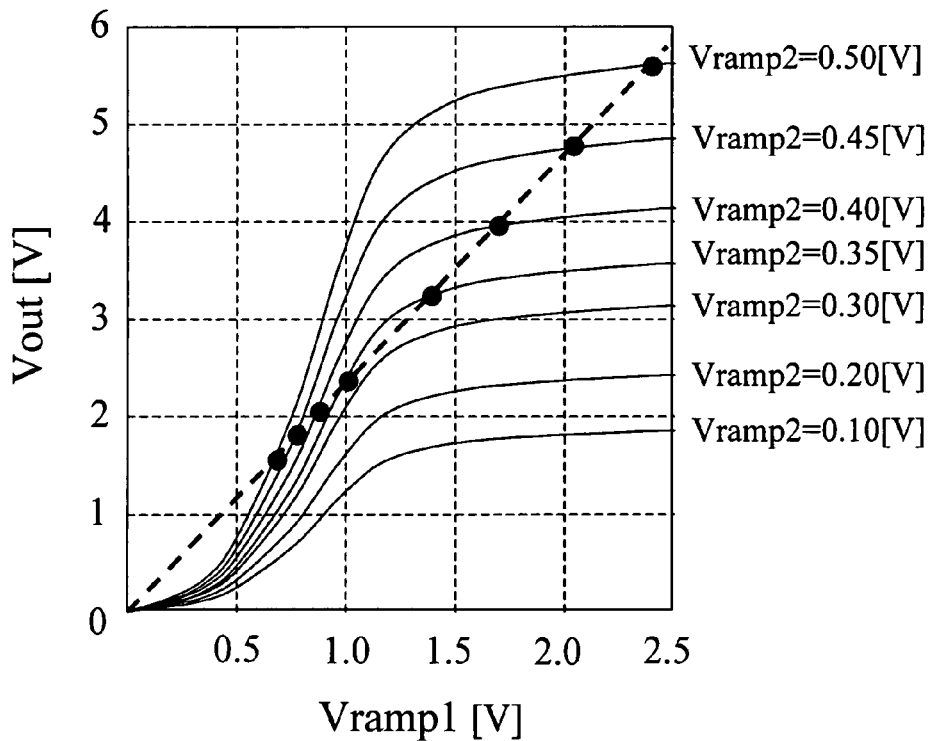
FIG. 6 is a diagram showing another relation among the output voltage Vout, the voltage Vramp1, and the voltage Vramp2 of the multistage amplifier apparatus 10 shown in FIG. 5.
FIG. 7 is a diagram showing an exemplary distortion compensation table 17 retained by the distortion compensation apparatus 4 shown in FIG. 5.

FIG. 6 is a diagram showing a relation among the output voltage Vout of the output signal Pout, which is outputted by the other multistage amplifier apparatus 10 shown in FIG. 5, the voltage Vramp1 of the amplitude signal AM1 which is provided to the power supply terminal 7 of the amplifier 2 and to the power supply terminal 17 of the amplifier 16, and the voltage Vramp2 of the amplitude signal AM2 which is provided to the power supply terminal 6 of the amplifier 1.

FIG. 7 is a diagram showing an exemplary distortion compensation table 18 previously retained by the distortion compensation apparatus 4. In the same manner as the method of preparing the above-described distortion compensation table 15 (see FIG. 4), it is possible to prepare the distortion compensation table 18 shown in FIG. 7 using FIG. 6. Accordingly, it is clear that even in the case where the amplifier section 13 of the other multistage amplifier apparatus 10 has the configuration in which three amplifiers are serially connected to one another, a similar effect can be obtained.

With regard to a signal Pin inputted to the amplifier section 3 or 13, even in the case where any one of a phase-modulated signal, an amplitude-modulated signal, a frequency-modulated signal, an amplitude/phase modulated signal, and an amplitude/frequency modulated signal is inputted, instead of a general signal, a useful effect of the present invention may be attained.

Further, in the above-described embodiment (see FIGS. 1 and 5), the distortion compensation apparatus 4 is connected to the amplifier 1 at a primary level. However, the distortion compensation apparatus 4 may be connected to an amplifier at another level than the primary level. Depending on the amplifier to which the distortion compensation apparatus 4 is to be connected, even though data amount (a quantity of the voltage Vramp2) of a distortion compensation table retained by the distortion compensation apparatus 4 is fixed, an output dynamic range of the multistage amplifier apparatus 10 varies. Therefore, it is preferable to connect the distortion compensation apparatus 4 to an amplifier which can optimize the output dynamic range and efficiency of the multistage amplifier apparatus 10.

Further, according to the above-described embodiment, the distortion compensation apparatus 4 is connected to one amplifier. However, in a multistage amplifier apparatus in which N amplifiers (N is an integer of two or more) are serially connected to one another, in accordance with an input/output characteristic of the multistage amplifier apparatus, the distortion compensation apparatus 4 can be connected to any of 1 to (N−1) amplifiers, that is, M amplifiers (M is a natural number lower than N). Even in this case, it is possible to attain the same effect as above described, and also possible to reduce the manufacturing costs and the power consumption. Further, a configuration of each of the M amplifiers may be selected arbitrarily.

Embodiment 1

Using the Multistage Amplifier Apparatus 10 of the Present Invention

Figure 9:
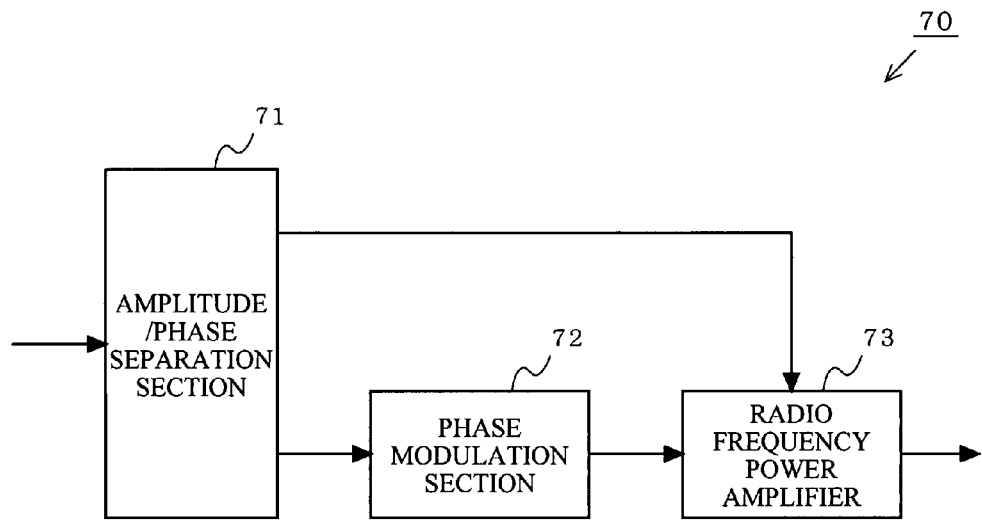
FIG. 9 is a diagram showing an exemplary polar modulation amplifier apparatus 70 which amplifies a signal using polar modulation.
Figure 10:
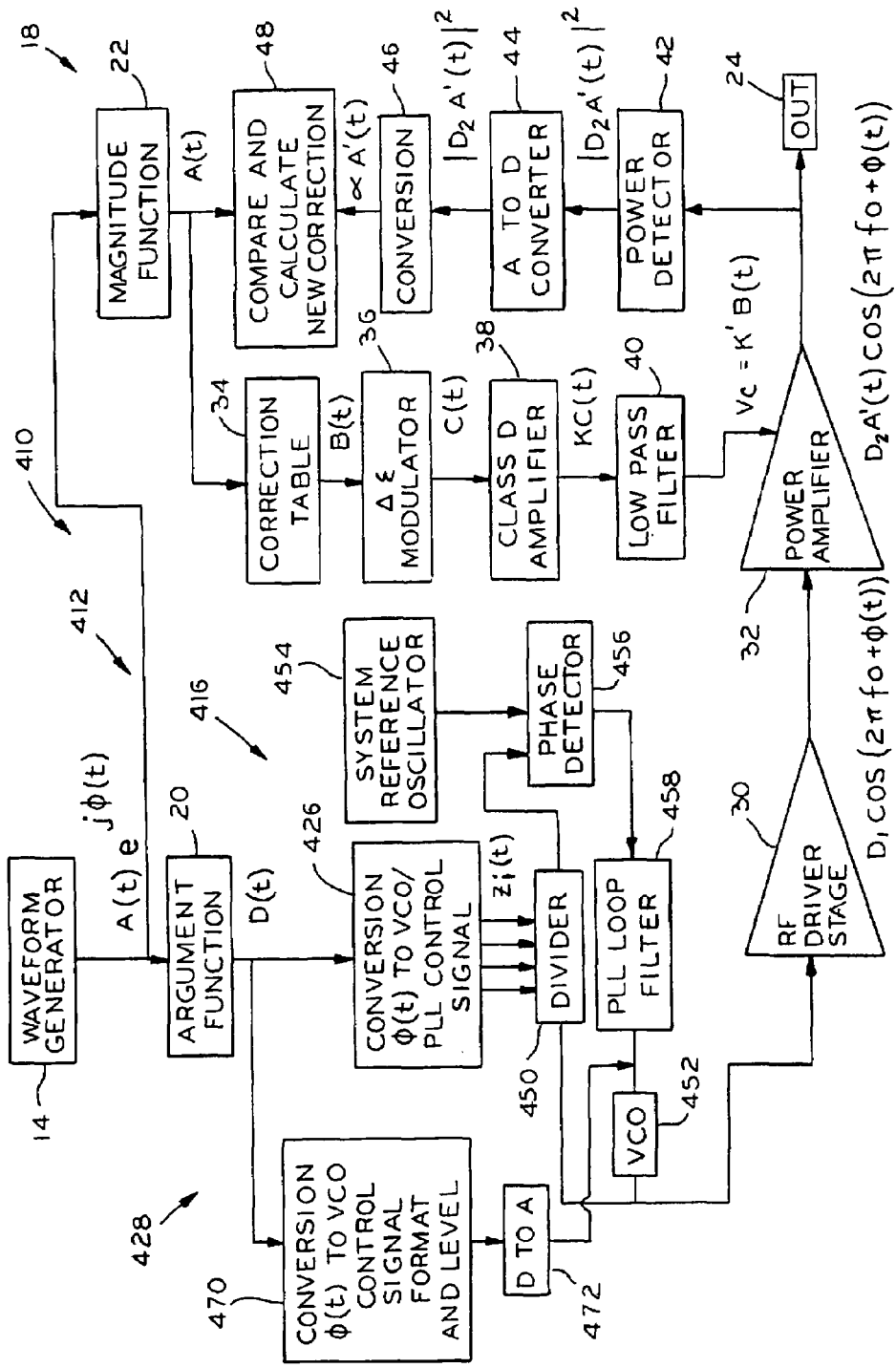
FIG. 10 is a diagram showing a configuration of a conventional amplifier apparatus disclosed in Patent Document 1.
Figure 11:
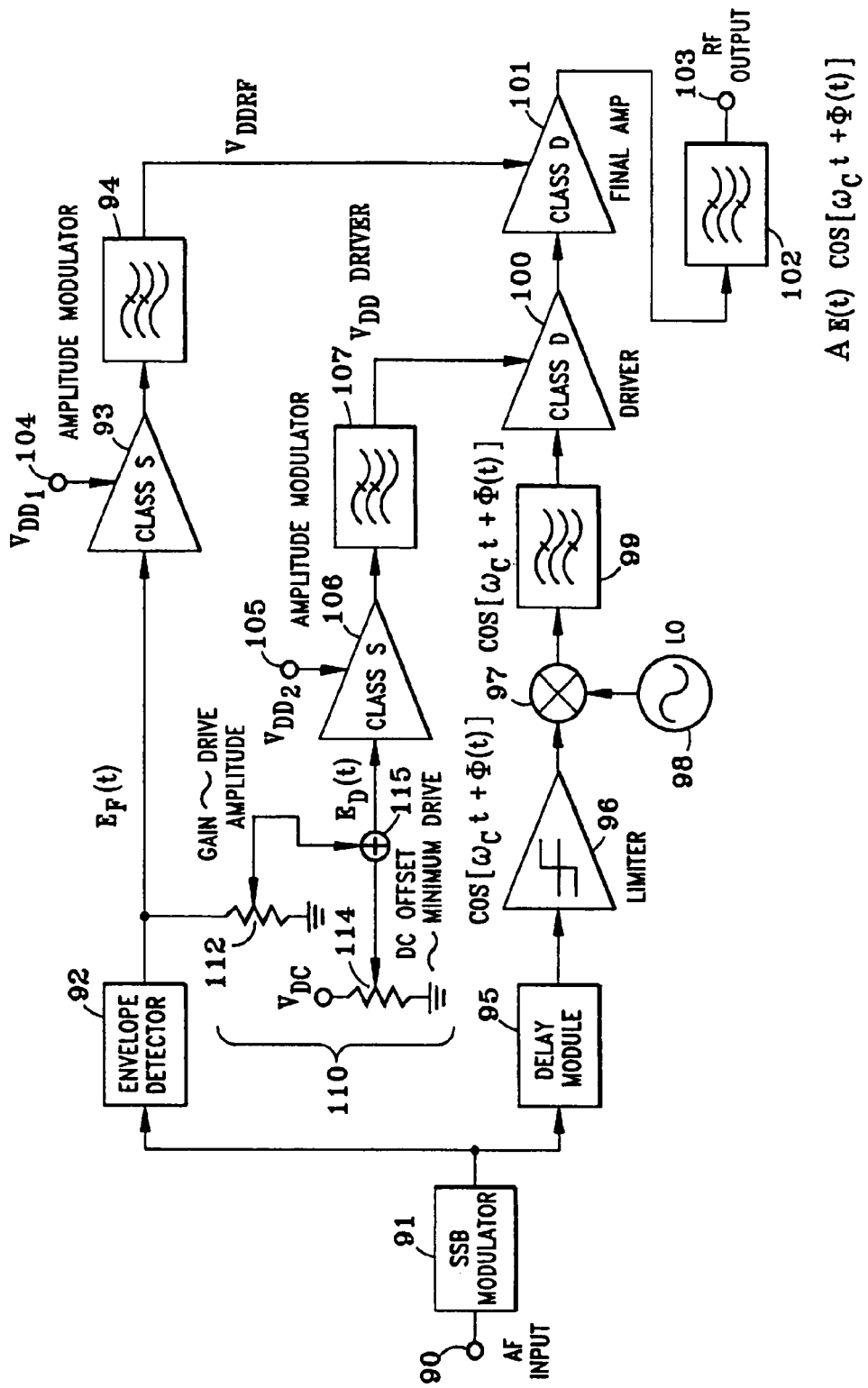
FIG. 11 is a diagram showing a configuration of a conventional amplifier apparatus disclosed in Patent Document 2.
Figure 12:
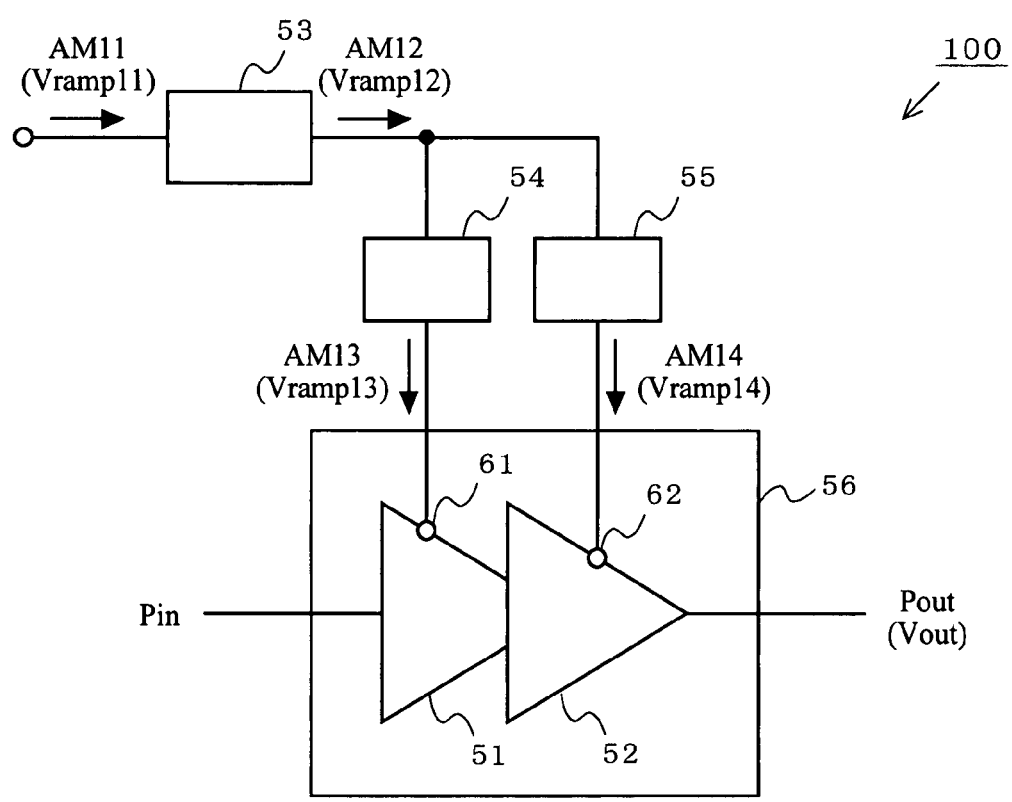
FIG. 12 is a diagram showing a configuration of a conventional multistage amplifier apparatus 100 using polar modulation.
Figure 13:
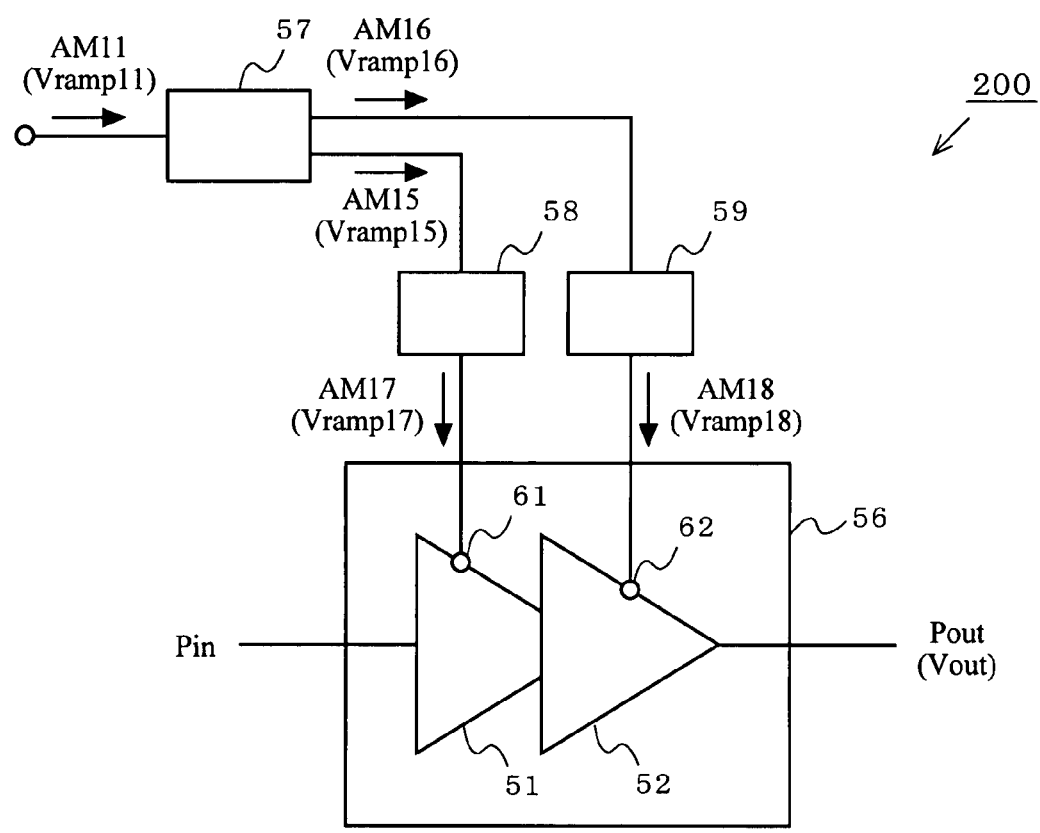
FIG. 13 is a diagram showing a configuration of a conventional multistage amplifier apparatus 200 using the polar modulation.

The multistage amplifier apparatus 10 of the above-described present invention may be applicable to the polar modulation amplifier apparatus 70 shown in FIG. 9 described in the background art. The polar modulation amplifier apparatus 70 shown in FIG. 9 includes an amplitude/phase separation section 71, a phase modulation section 72, and a radio frequency power amplifier 73. The amplitude/phase separation section 71 separates an inputted transmission signal into an amplitude signal and a phase signal. The phase modulation section 72 performs phase modulation on the separated phase signal. The radio frequency power amplifier 73 modulates, using the separated amplitude signal, the phase-modulated signal performed by the phase modulation section 72.

In a configuration of the polar modulation amplifier apparatus 70 shown in FIG. 9, it is possible to use the multistage amplifier apparatus 10 of the present invention for the radio frequency power amplifier 73. As a result it is possible to compensate for distortion of an output signal, and also possible to realize a polar modulation amplifier apparatus 70 which suppresses an increase in a circuit scale, and also reduces manufacturing costs and power consumption.

Embodiment 2

Using the Multistage Amplifier Apparatus 10 of the Present Invention

Figure 8:
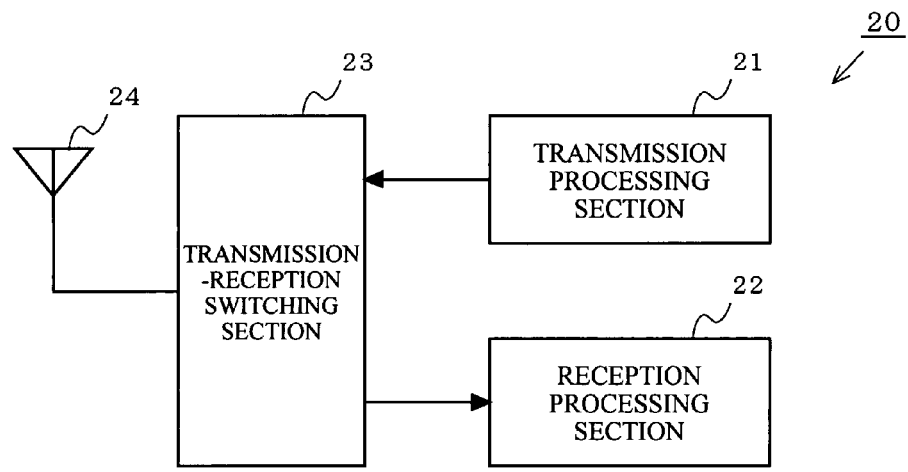
FIG. 8 is a diagram showing an exemplary configuration of a wireless communication apparatus 20 in which the multistage amplifier apparatus 10 of the present invention is applied.

FIG. 8 shows a configuration of a wireless communication apparatus 20 in which the multistage amplifier apparatus 10 of the present invention is applied. The wireless communication apparatus 20 includes a transmission processing section 21, a reception processing section 22, an antenna 24, a transmission-reception switching section 23 which switches between a state in which a transmission signal is provided from the transmission processing section 21 to the antenna 24 and a state in which a received signal is provided from the antenna 24 to the reception processing section 22. In this configuration, the multistage amplifier apparatus 10 of the present invention is incorporated in the transmission processing section 21. The wireless communication apparatus 20 is, for example, typified by a cellular phone, a portable wireless terminal such as a portable information terminal or the like which includes a communication function, or a wireless base station.

At the time of a transmitting operation, the transmission processing section 21 outputs the transmission signal generated through a transmission processing to the transmission-reception switching section 23. The transmission-reception switching section 23 outputs the transmission signal having been inputted thereto to the antenna 24. The antenna 24 transmits the transmission signal having been inputted thereto.

At the time of a receiving operation, the antenna 24 outputs a received signal having been transmitted thereto to the transmission-reception switching section 23. The transmission-reception switching section 23 outputs the received signal having been inputted thereto to the reception processing section 22. The reception processing section 22 receives the received signal and performs the reception processing.

In this manner, the transmission processing section 21 includes the multistage amplifier apparatus 10, whereby the distortion of the transmission signal can be compensated. It is also possible to realize the wireless communication apparatus 20 which suppresses an increase in a circuit scale and also reduces manufacturing costs and power consumption.

While the invention has been described in detail, the foregoing description is in all aspects illustrative and not restrictive. It is understood that numerous other modifications and variations can be devised without departing from the scope of the invention.

What is claimed is:

1. A multistage amplifier apparatus for amplifying an input signal using a control signal, the multistage amplifier apparatus comprising:

an amplifier section in which N amplifiers (N is an integer of 2 or more) are serially connected to one another, for performing amplitude modulation on the input signal using an amplitude signal which is the control signal; and M distortion compensation apparatuses (M is a natural number satisfying M<N) which are provided so as to respectively correspond to M amplifiers among the N amplifiers, each for retaining a distortion compensation table in which a voltage of the amplitude signal and a distortion compensated voltage are correlated with each other, and the M distortion compensation apparatuses each providing, based on the distortion compensation table, the distortion compensated voltage which is correlated with the control signal, to a power supply terminal of a corresponding amplifier of the M amplifiers, wherein to power supply terminals of (N−M) amplifiers, to which the distortion compensated voltage is not inputted by the M distortion compensation apparatus, the voltage of the amplitude signal is directly provided.

2. The multistage amplifier apparatus according to claim 1, wherein the distortion compensated voltage is a voltage which allows a linear relationship between the voltage of the amplitude signal and a voltage to be outputted by the amplifier section.

3. The multistage amplifier apparatus according to claim 1, wherein the input signal is a phase-modulated signal.

4. The multistage amplifier apparatus according to claim 2, wherein the input signal is a phase-modulated signal.

5. The multistage amplifier apparatus according to claim 1, wherein the input signal is a frequency-modulated signal.

6. The multistage amplifier apparatus according to claim 2, wherein the input signal is a frequency-modulated signal.

7. The multistage amplifier apparatus according to claim 1, wherein the input signal is an amplitude-modulated signal.

8. The multistage amplifier apparatus according to claim 2, wherein the input signal is an amplitude-modulated signal.

9. The multistage amplifier apparatus according to claim 1, wherein the input signal is an amplitude/phase modulated signal.

10. The multistage amplifier apparatus according to claim 2, wherein the input signal is an amplitude/phase modulated signal.

11. The multistage amplifier apparatus according to claim 1, wherein the input signal is an amplitude/frequency modulated signal.

12. The multistage amplifier apparatus according to claim 2, wherein the input signal is an amplitude/frequency modulated signal.

13. A polar modulation amplifier apparatus comprising:

an amplitude/phase separation section for separating a transmission signal to be inputted thereto into an amplitude signal and a phase signal;

a phase modulation section for performing phase modulation on the phase signal; and the multistage amplifier apparatus described in claim 3 for performing, by using the amplitude signal, amplitude modulation on the phase signal on which phase modulation is performed by the phase modulation section.

14. A wireless communication apparatus for performing communication using an antenna, the wireless communication apparatus comprising:

a transmission processing section including the multistage amplifier apparatus described in claim 1 for performing transmission processing and outputting a transmission signal;

a reception processing section for performing reception processing on a received signal which is received by the antenna; and a transmission-reception switching section for switching between a state in which the transmission signal is provided from the transmission processing section to the antenna and a state in which the received signal is provided from the antenna to the reception processing section.

* * * * *